United States Patent [19]
Tamaki et al.

[11] Patent Number: 5,920,883
[45] Date of Patent: Jul. 6, 1999

[54] MEMORY DEVICE USING BLOCK WRITE MODE, SIMULTANEOUS COLUMN WRITES WITH COLUMN ADDRESS SELECTION CIRCUIT AND SEGMENT START/STOP ADDRESS LATCHES

[75] Inventors: Satoshi Tamaki; Moemi Fujio, both of Tokyo, Japan

[73] Assignee: NEC Corporation, Tokyo, Japan

[21] Appl. No.: 08/756,518

[22] Filed: Nov. 26, 1996

[30] Foreign Application Priority Data

Nov. 29, 1995 [JP] Japan .................................. 7-311266

[51] Int. Cl.⁶ .................................................. G06F 12/00
[52] U.S. Cl. ...................... 711/101; 711/104; 365/230.03
[58] Field of Search ......................... 365/230.01, 230.03, 365/238.5; 345/519; 711/101

[56] References Cited

U.S. PATENT DOCUMENTS

| 5,134,589 | 7/1992 | Hamano | 365/238.5 |
| 5,305,278 | 4/1994 | Inoue | 365/230.03 |
| 5,422,998 | 6/1995 | Margolin | 345/519 |
| 5,657,287 | 8/1997 | McLaury et al. | 365/230.01 |

FOREIGN PATENT DOCUMENTS

| 63-292494 | 11/1988 | Japan . |
| 3-73489 | 3/1991 | Japan . |
| 5-182456 | 2/1993 | Japan . |
| 6-20466 | 1/1994 | Japan . |

OTHER PUBLICATIONS

"4M–Bit Dual Port Graphics Buffer 256K Words by 16 Bits", NEC, document No. IC–3585, Mar. 1995, pp. 27–29.

*Primary Examiner*—Tod R. Swann
*Assistant Examiner*—David Langjahr
*Attorney, Agent, or Firm*—Foley & Lardner

[57] ABSTRACT

A column address selection circuit 1 is provided, which renders all column address signals (CSi), from a start address to a stop address designated by a column address signal (ADCd+ADCu), to be a selective level when a segment address selection signal (SASj) and a block write signal (BW) are at an active level. A segment address selection circuit 2 is provided, which renders all segment address selection signals (SASj), from the start address to the stop address designated by the column address signal (ADCu) of a superordinate side, to be a selection level to supply it to the column address selection circuit 1, when the block write signal (BW) is at the active level.

6 Claims, 9 Drawing Sheets

| CA5 | A5 | A5 | 1 |
|---|---|---|---|
| CA5* | A5* | A5* | 1 |
| CA6 | A6 | 1 | 1 |
| CA6* | A6* | 1 | 1 |
| | 00 | 01 | 11 |
| | ASC | | |

MEMORY DEVICE USING BLOCK WRITE MODE, SIMULTANEOUS COLUMN WRITES WITH COLUMN ADDRESS SELECTION CIRCUIT AND SEGMENT START/STOP ADDRESS LATCHES

BACKGROUND OF THE INVENTION

1. Field of the Invention

The present invention relates to a semiconductor memory device, more particularly to a semiconductor memory device which has a block write function to write the same data into a plurality of rows.

2. Description of the Related Art

In ordinary semiconductor memory devices, when data writing and reading are done for a memory cell of one address incorporated in a memory cell array which includes a plurality of memory cells arranged in a matrix, usually, one row of the memory cell array is selected by a row selection circuit and one column thereof is selected by a column selection circuit, whereby the memory cell disposed at the cross point is selected.

On the other hand, of the semiconductor memory devices for image processing, in order to obtain a high speed operation for the image processing, there has been a semiconductor memory device having a block write function in which the same data is written simultaneously to the memory cells of a plurality of continuous column addresses, for example, 4 addresses, and eight addresses and so on.

Figure 1:
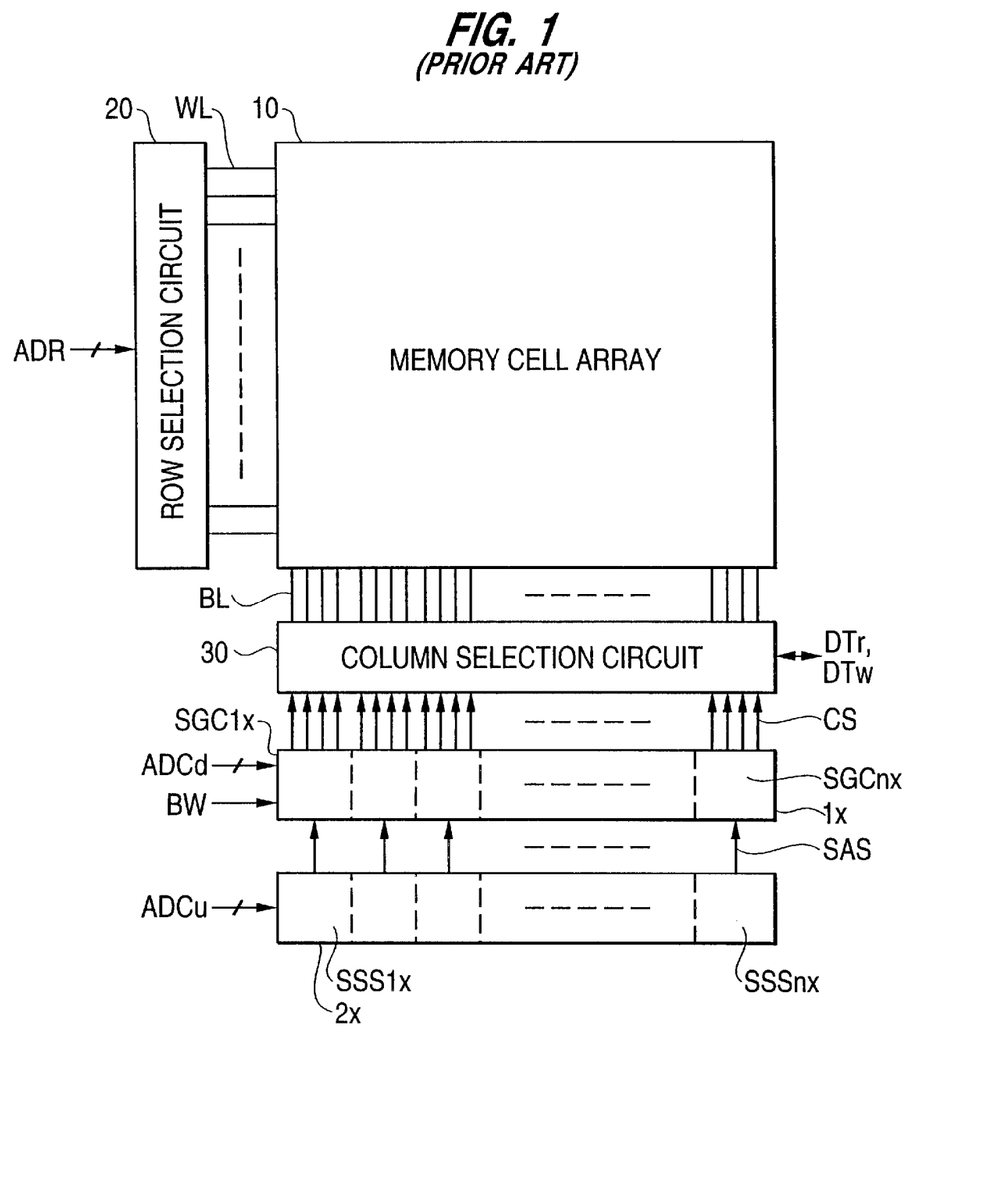
FIG. 1 is a block diagram showing an example of a conventional semiconductor device.

An example of such semiconductor device having the block write function is shown in FIG. 1.

The semiconductor memory device shown in FIG. 1 comprises a memory cell array 10 which includes a plurality of memory cells arranged in a matrix in row and column directions; a row selection circuit 20 which selects these memory cells arranged in the same row according to a row address signal ADR via word lines WL corresponding to each row of the memory cell; a column selection circuit 30 which selects a prescribed bit line among bit lines BL corresponding to each of the memory cell columns (hereinafter referred to as a column) according to a column address selection signal CS and transmits writing data DTw to the memory cell disposed at a cross point of the selected row and column and reads out (DTr) the data from this memory cell; and segment circuits SGC1x to SGCnx which divide the columns of the memory cell array 10 corresponding to each bit line BL into segments, each segment consisting of adjacent columns, for example, four columns. The semiconductor memory device further comprises a column address selection circuit 1x which includes segment circuits SGC1x to SGCnx and renders a prescribed column address signal among the column address selection signals CS to a selection level according to a segment address selection signal SAS, a subordinate bit of the column address signal (hereinafter referred to as a subordinate column address signal) ADCd, and a block write signal BW; and a plurality of selection segment address set circuits SSS1x to SSSnx, each of which corresponds to a corresponding one of the segment circuits SGC1x to SGCnx. The semiconductor memory device further comprises a segment address selection circuit 2x which includes selection segment address set circuits SSS1x to SSSnx and renders one among the segment address selection signals SAS to a selection level according to a superordinate bit of the column address signal (hereinafter referred to as a superordinate column address signal) ADCu.

Figure 2:
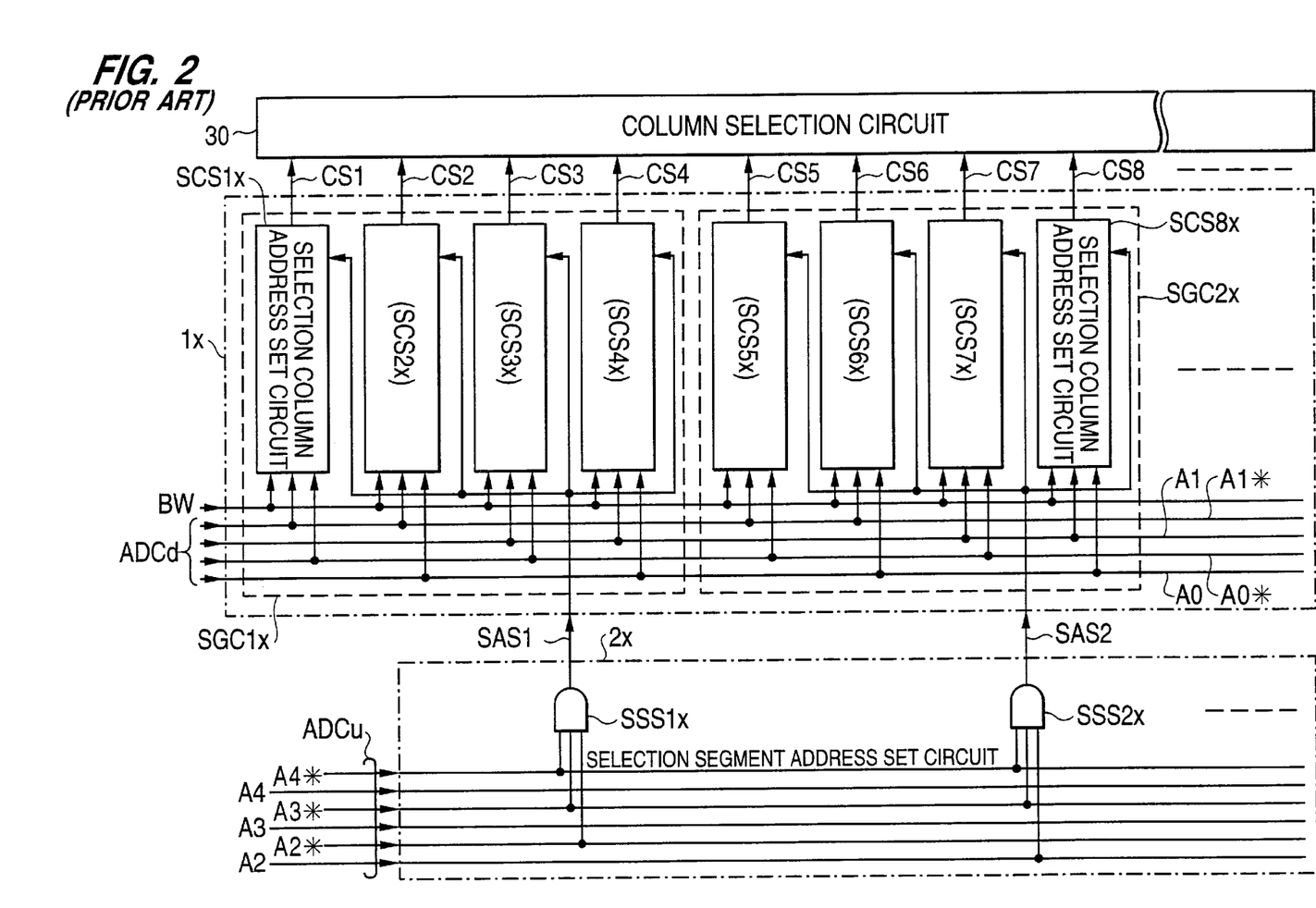
FIG. 2 is a detailed block diagram of a major portion of the semiconductor memory device shown in FIG. 1.
Figure 3:
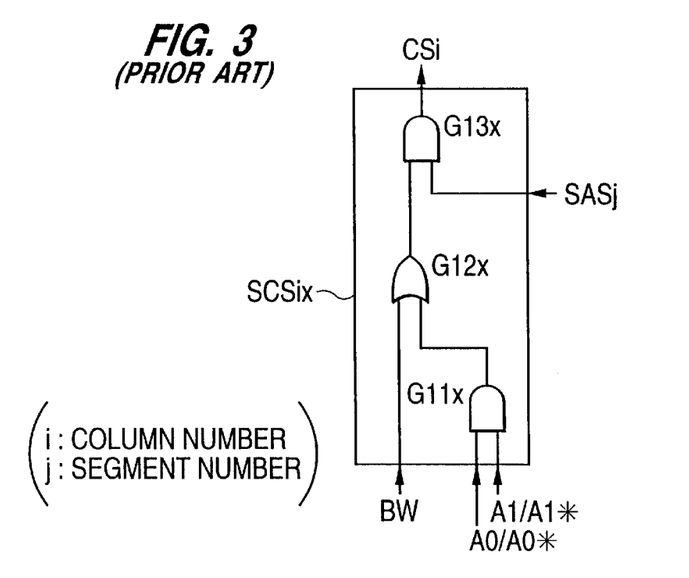
FIG. 3 is a circuit diagram showing a concrete example of a selection column address set circuit of the semiconductor memory device shown in FIG. 2.

A more detailed block diagram and circuit diagram of the column address selection circuit 1x and segment address selection circuit 2x are shown in FIGS. 2 and 3.

Each of the segment circuits SGC1x to SGCnx of the column address selection circuit 1x includes the selection column address set circuits (SCS1X to SCS4x/SCS5x to SCS8x/ . . . ) corresponding to the column included in the corresponding segment, each of the selection column address set circuit including AND type logic gates G11x and G13x and an OR type logic gate G12x as shown in FIG. 3. Furthermore, each of the selection segment address set circuits SSS1x to SSSnx of the segment address selection circuit 2x consists of an AND type logic gate.

Next, a column address selection operation of the semiconductor memory device will be described.

First, on normal writing and reading operation modes (hereinafter as a normal operation mode), the block write signal BW is in an inactive level at low level, and the selection column address set circuit SCS1x to SCSnx decodes the subordinate column address signal ADCd (including constituent bits A0 and A1, and inverted signals thereof A0* and A1*) to transmit the decoded signal to the logic gate G13x via the logic gate G12x.

On the other hand, the selection segment address set circuit SSS1x to SSSnx decodes the superordinate column address signal ADCu (including constituent bits A2 to A4 and inverted signals thereof A2* to A4*, and, in this case, "n" of SSSnx is 8), and renders one among the segment address selection signals SAS1 to SASn to a selection level ("1"). Then, the selection segment address set circuit SSS1x to SSSnx transmits it to the logic gate G13x of the selection column address set circuit of the corresponding segment circuit.

Accordingly, the column address selection signal (CS3) from the selection column address set circuit, for example, SCS3x, is rendered to a selection level. The column address set circuit includes the logic gate G12x to decode the subordinate column address signal ADCd in the segment circuit (SGC1x) corresponding to the segment address selection signal, for example, SAS1, at a selection level. The column corresponding to the column address selection signal (CS3) is selected by the column selection circuit 30. Specifically, one column among the columns of the memory cell array 10 is selected by the subordinate address signal ADCd and the superordinate address signal ADCu.

Subsequently, an operation in a block write mode will be described.

Figure 4:
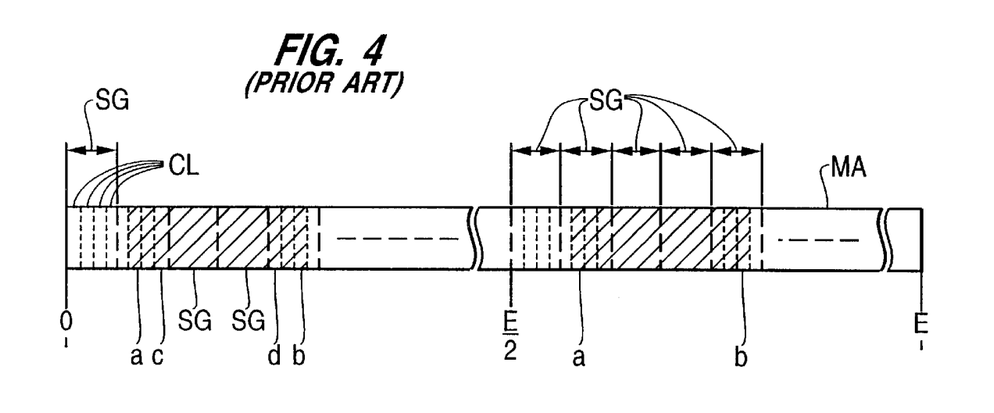
FIG. 4 is a drawing showing a memory region and a selected region thereof for explaining an operation of the semiconductor memory device shown in FIGS. 1 to 3.

For example, as shown in the portion of the left of FIG. 4, it is assumed that the same data be written to the segments SG disposed from an address "a" to an address "b" in the memory region MA of the memory cell array 10. The column addresses and the segment addresses in the memory region MA are sequentially arranged such that the one disposed in the left end is the least significant address and the one disposed in the right end is the most significant address. In addition, in the segment SG in which addresses "a" and "b" of the column address are included, the column address (disposed on the subordinate side of the address "a" and disposed on the superordinate side of the address "b") to write data different from the foregoing data shall be included.

When rendering the block write signal BW to be an active level ("1"), all of the column address selection signals (CSi, i: column number) in the segment corresponding to the segment address signal selection signal (SASj, j: segment number) at the selection level will become the selection level. Accordingly, when the segment columns (a to c, d to b) are selected, in which the address "a" and "b" of the column address are included, with the block write signal BW kept at an inactive level, the segment column address selection operation is performed in the normal operation mode. In case of columns composed of segments SG interposed between the segments including the address "a" and "b" of the column address the segment address selection signal corresponding to the segments is sequentially rendered to the selection level, at the same time the block write signal is rendered to the active level and all of the column address selection signals included in this segment are rendered to the selection level. Therefore, selections of the columns included in each of the segments can be done simultaneously so that the writing operation will be performed quickly.

Furthermore, as shown in the portion of the right side of FIG. 4, it is usual that the memory region MA is divided into two areas composed of the subordinate side (0 to E/2) and the superordinate side (E/2 to E) and the same data is written to the address extents (a to b, and E/2+a to E/2+b) corresponding to these two areas. In this case, the column selection operation from the foregoing address "a" to the address "b" may be similarly performed also from the address "E/2+a" to "E/2+b".

In the foregoing conventional semiconductor device, when the same data is written to the segments ranging from the number "a" to the number "b" of the column address, and also when the column is included to which the different data from the foregoing data are written in the segment including the numbers "a" and "b" of the column address, writing and reading of data are performed one column by one column according to the similar operation to the normal writing operation, and for the segment interposed between the segments including the numbers "a" and "b" of the column address, the operations that all columns in this segment are selected and writing is sequentially performed for each segment are sequentially performed. Therefore, the selection and writing operations in the normal operation mode are needed, and, moreover, in the segments using the block write mode, the selection and writing operations are sequentially performed for every segment. Thus, the difficulty of the operation to write the same data to the prescribed extent quickly and the complexity of the operations are brought about. Even when the same data is written to a plurality of extents, the same selection and writing operations are sequentially performed for each extent, it is also difficult to perform a high speed operation.

SUMMARY OF THE INVENTION

The object of the present invention is to provide a semiconductor memory device which can achieve a high speed operation on writing the same data to a prescribed extent as well as a simplification of the operation.

In a semiconductor memory device of the present invention in which the same data are written, in a block write mode, to prescribed memory cells belonging to a plurality of memory cell columns of a memory cell array having the memory cells arranged in row and column directions in a matrix;

the semiconductor memory device is constituted such that, in the block write mode, the memory cell columns that correspond, from a start address to a stop address, are simultaneously selected to write the same data to each of the prescribed remory cells of the selected memory cell columns; and wherein the semiconductor memory device comprises:

a memory cell array in which a plurality of memory cells are arranged in row and column directions in a matrix;

a row selection circuit which simultaneously selects the memory cells of the memory cell array belonging to the same row;

a column selection circuit which selects a prescribed memory cell column of the memory cell array according to a column address selection signal;

a column address selection circuit which comprises a plurality of start address latch circuits and stop address latch circuits, each of which is arranged corresponding to one of the memory cell columns of the memory cell array; and in which in the block writer mode, a start address signal of an active level is set to the start address latch circuit of the memory cell column corresponding to a start address in the first timing, a stop address signal of an active level is set to the stop address latch circuit of the memory cell column corresponding to a stop address in the second timing, and the column address signal from the memory cell column corresponding to the start address signal of the active level to the memory cell column corresponding to the stop address signal of the active level is rendered to be a selective level; and wherein a plurality of segment start address latch circuits and a plurality of segment stop address circuits are provided, each of which is arranged to correspond to one of the segments, and which divide all of the memory cell columns of the memory cell array into a plurality of segments, each of the segments corresponding to the memory cell columns of a predetermined number adjacent to each other, and divide the start address latch circuits and stop address latch circuits of the column address selection circuit corresponding to the segments; and a segment address selection circuit is provided, in which in a block write mode, a segment start address signal of an active level is set, at the first timing, to a segment address latch circuit of the segments corresponding to a segment start address by a prescribed superordinate side bit of a column address signal, and a segment stop address signal of an active level is set, at the second timing, to a segment stop address latch circuit of the segment corresponding to a segment stop address by a prescribed superordinate side bit of the column address signal, whereby a segment address selection signal, from a segment corresponding to said segment start address signal of an active level to a segment corresponding to said segment stop address signal of an active level, is rendered to be a selection level; and wherein the column address selection circuit is constituted such that setting of a start address signal of an active level to a start address latch circuit and setting of a stop address signal of an active level to a stop address latch circuit are performed by a prescribed subordinate side bit of the column address signal; and a column address selection signal, from a memory cell column corresponding to a start address to a memory cell column corresponding to a stop address due to the column address signal, is rendered to be a selection level, the column address signal being obtained by combining a subordinate bit with a superordinate bit by the segment address selection signal, the start address signal and the stop address signal.

Furthermore, a selection region set circuit is provided, in which an address region of a memory cell column of a memory cell array is divided into a plurality of areas which are capable of being selected by a predetermined bit of column address signals, and a level of the prescribed bit of said column address signal is controlled to determine either individual selection of the areas or simultaneous selection of the prescribed areas among the areas by the prescribed bit of the column address signals, and the column address selection circuit is constituted such that the start address signal of an active level and the stop address signal of an active level are set corresponding to each of the selected areas by the selection region set circuit.

BRIEF DESCRIPTION OF THE DRAWINGS

FIG. 10 (A) is a circuit diagram showing a concrete example of a selection region set circuit of the embodiment shown in FIG. 9;

FIG. 10 (B) is a table showing a signal level for explaining an operation of the selection region set circuit of FIG. 10 (A); and FIGS. 11 (A), 11 (B), and 11 (C) are drawings showing selection regions for explaining an operation of the embodiment shown in FIG. 9.

DETAILED DESCRIPTION OF THE PREFERRED EMBODIMENTS

Embodiments of the present invention will be described with reference to the accompanying drawings.

Figure 5:
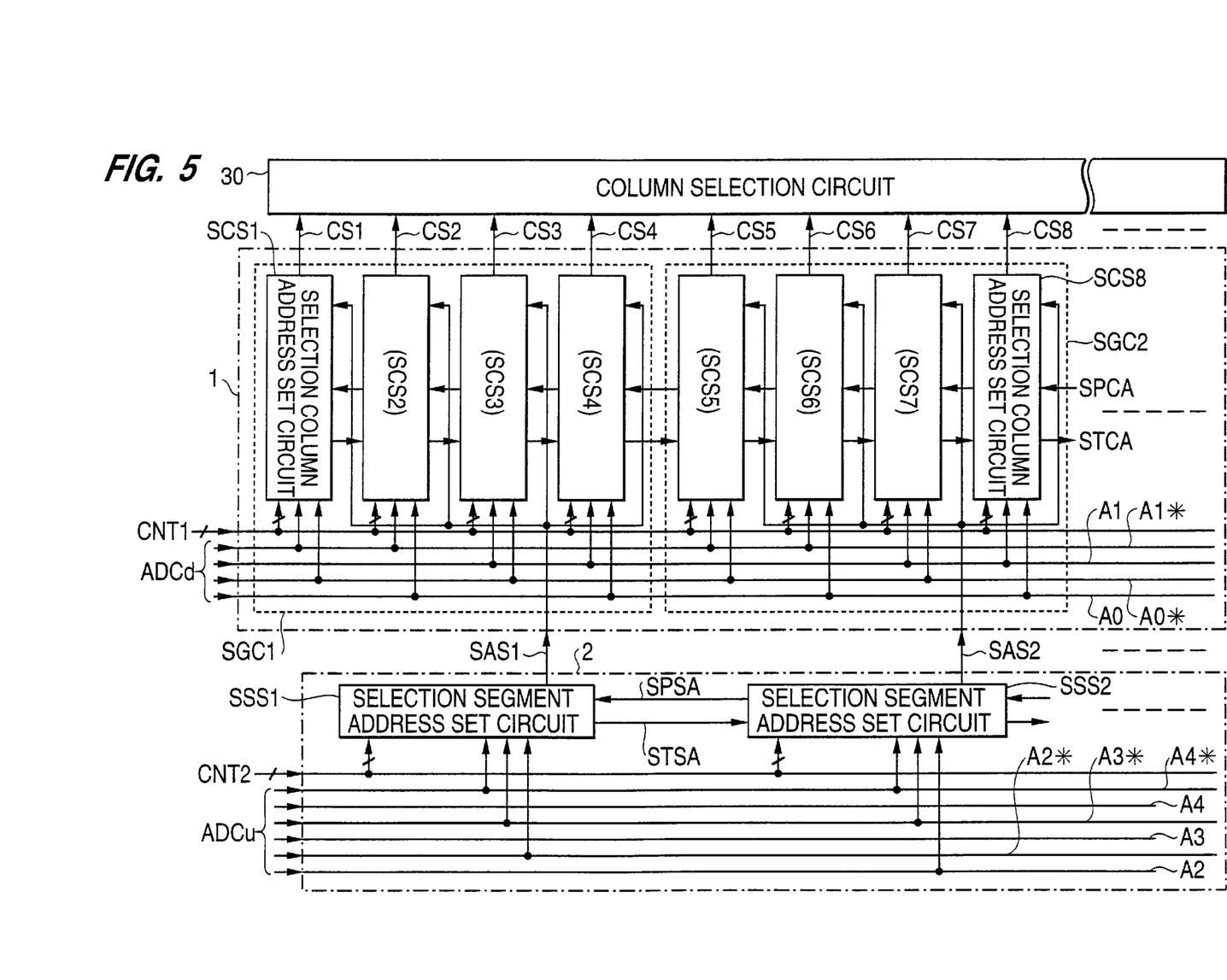
FIG. 5 is a block diagram showing a first embodiment of the present invention.

FIG. 5 is a block diagram showing a first embodiment of the present invention. It should be noted that a memory cell array 10 and a row selection circuit 20 and the like are omitted in FIG. 5.

A column address selection circuit 1 includes a plurality of selection column address set circuits (SCS1~SCS8, . . . ), each of which is arranged corresponding to one of the columns of the memory cell array 10 and comprises a start address latch circuit and a stop address latch circuit. In a block write mode, where a block write signal (BW) from among control signals (CNT1) is at an active level, the start address latch circuit is set to correspond to a start address by a subordinate column address signal {ADCd (constituent bits A0 and A1, and inverted signals thereof A0* and A1*)} that is set according to a start address latch signal (STL) from among the control signals (CNT1); and a start address signal (STCA), which is an output signal from this latch circuit, is set to be an active level. When a segment address selection signal (SAS) corresponding to a segment address is at a selection level, it is sequentially transmitted to a superordinate side. A stop address latch circuit set to correspond to a stop address by a subordinate column address signal ADCd is set according to a stop address latch signal (SPL) from among the control signals (CTN1); and a stop address signal (SPCA), which is an output signal from this latch circuit, is set to be an active level. When a segment address selection signal corresponding to a segment address is at the selection level, it is sequentially transmitted to the subordinate side. The column address selection signals (CSi, i: column number), which are supplied in a range from the column set to correspond to the start address to the column set to correspond to the stop address by the column address signal (ADC), which includes the subordinate and superordinate bits, are rendered to the selection level.

A segment address selection circuit 2 includes selection segment address set circuits (SSS1, SSS2, . . . ), each of which is arranged corresponding to the segments, each segment including a group of adjacent columns, all columns of the memory cell array 10 are divided into a plurality of groups composed of the prescribed number of columns (for example, four columns in FIG. 5). Each of the selection segment address set circuit (SSS1, SSS2, . . . ) comprises a segment start address latch circuit and a segment stop address latch circuit. The segment start address latch circuit corresponding to the segment start address by the superordinate column address signal {ADCu (constituent bits A2, A3, and A4, and inverted signals A2*, A3*, and A4*)} is set according to the start address latch signal (STL). The segment start address signal (STSA), which is an output signal from this latch circuit, is set to be an active level, and it is transmitted to the superordinate side. The segment stop address latch circuit corresponding to the segment stop address by the superordinate column address signal (ADCu) is set according to the stop address latch signal (SPL), and the segment stop address signal (SPSA), which is its output, is set to be an active level to be transmitted to the subordinate side. Then, the segment address selection signals (SASj, j: a segment number), from the segment in which the segment start address signal (STSA) is at the active level to the segment in which the segment stop address signal (SPSA) is at the active level, are rendered to a selective level, and the signals are supplied to the column address selection circuit 1.

Figure 6:
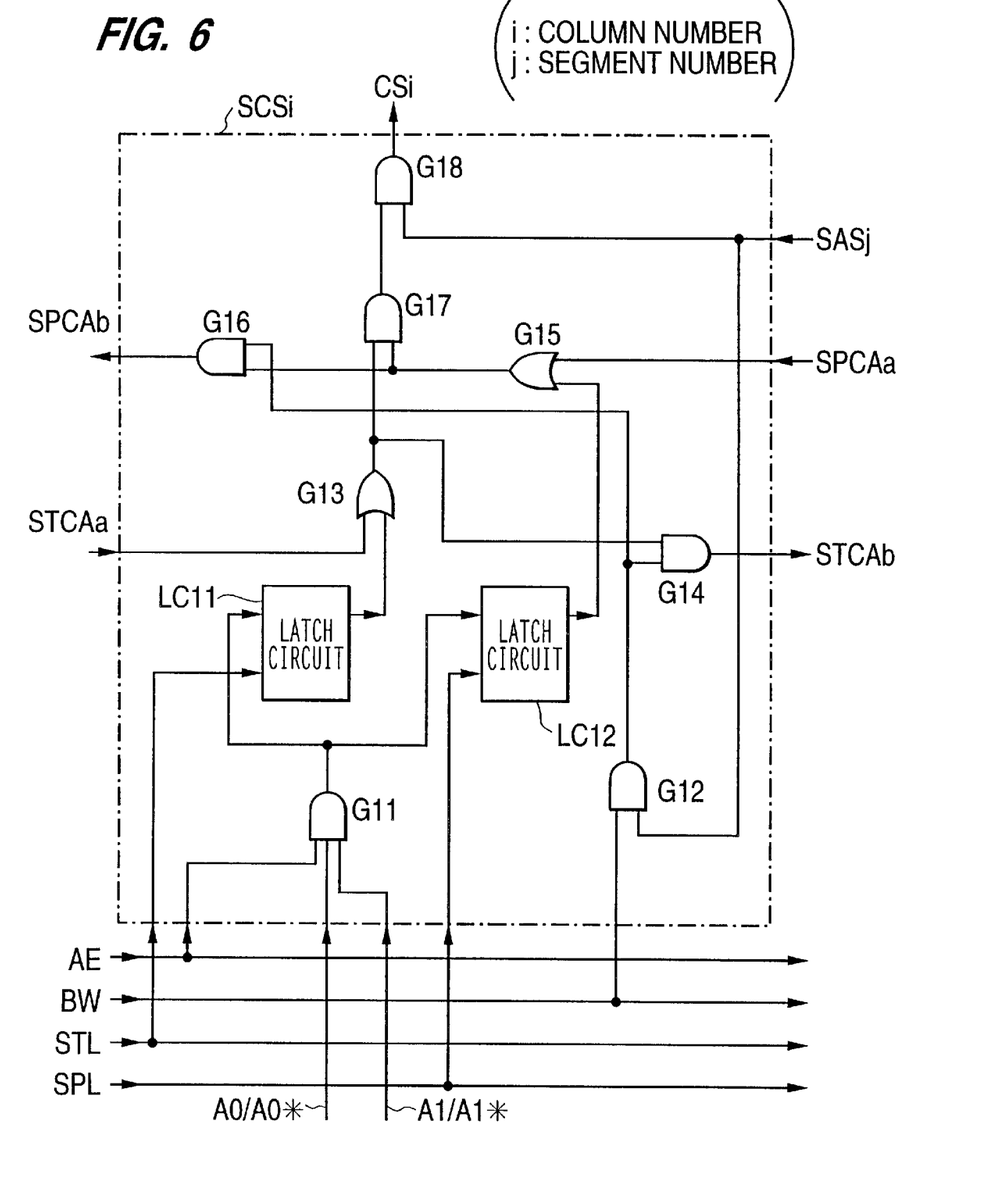
FIG. 6 is a circuit diagram showing a concrete example of a selection column address set circuit of the embodiment shown in FIG. 5.
Figure 7:
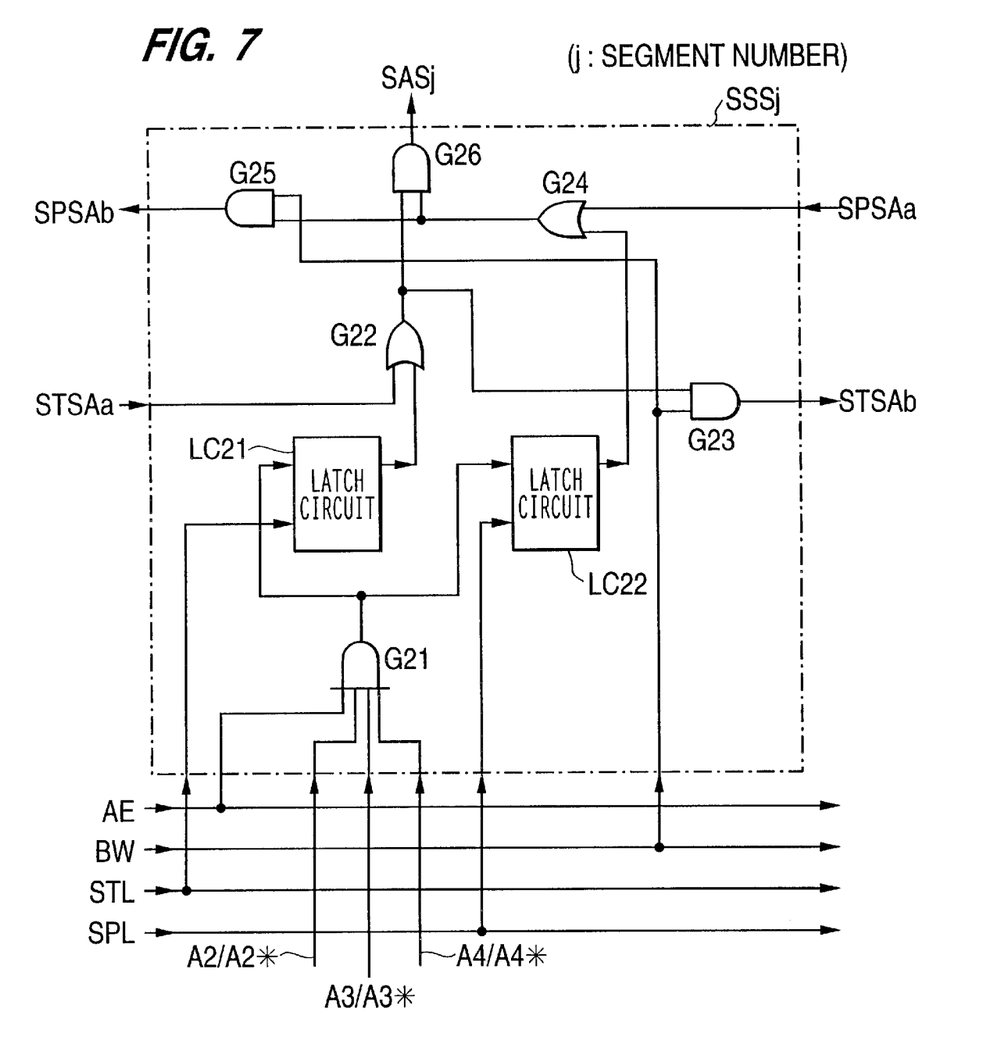
FIG. 7 is a circuit diagram showing a concrete example of a selection segment address set circuit of the embodiment shown in FIG. 5.

A concrete circuit example of the selection column address set circuit SCSi (i: a column number) is shown in FIG. 6, and a concrete circuit example of the selection segment address set circuit SSSj is shown in FIG. 7.

The selection column address set circuit SCS1 comprises an AND type logic gate G11 which decodes the subordinate column address signal (ADCd); a latch circuit LC11 which performs a latch operation according to this logic and sets the start address signal (STCA) to the active level; a latch circuit LC12 which performs a latch operation according to a stop address latch signal (SPL) and sets the stop address signal (SPCA) to the active level; a logic gate G13 which performs an OR processing for an output from the latch circuit LC11 and the start address signal (STCAa) from the subordinate address; a logic gate G15 which performs an OR processing for an output from the latch circuit LC12 and the stop address signal (SPCAa) from the superordinate address; a logic gate G14 which transmits an output from the logic gate G13 to the superordinate address when the block write signal (BW) is at the active level and the segment address selection signal SASj is at the selective level; a logic gate G16 which transmits an output from the logic gate G15 to the subordinate address; a logic gate G17 which performs an AND processing for outputs from the logic gates G13 and G15; and a logic gate G18 which outputs an output from the logic gate G17 as the column address selection signal (CSi) when the segment address selection signal SASj corresponding thereto is at the selective level.

With such circuit configuration, in the block write mode, in the segment where the segment address selection signal (SASj) is at a non-selective level, there is no transmission of the start address signal (STCA) to the superordinate address and there is no transmission of the stop address signal (SPCA) to the subordinate address. In the segment where the segment address selection signal (SASj) is at the selective level, the start address signal (STCA) is transmitted to the superordinate address and the stop address signal (SPCA) is transmitted to the subordinate address. Among the selected segments, the output from the logic gate G13 for the start address signal of all superordinate addresses of the selected segment from the address, in which the start address signal (STCA) of the least significant address is set to be the active level, is rendered to the active level. An output from the logic gate 15 for the stop address signal of all subordinate addresses of the selected segment from the address, in which the stop address signal (SPCA) of the segment of the most significant address is set to be the active level, is rendered to the active level. The column address selection signal (CSi) of the address in which the start address signal (STCA) and the stop address signal (SPCA) at the active level are superposed is rendered to be the selective level, by the logic gates G17 and 18.

The address in which the start address signal (STCA) of the segment of the least significant address among the selected segments is set to be the active level and the address in which the stop address signal (SPCA) of the segment of the most significant address is set to be the active level are the addresses designated by the column address signal ADC (A0 to A4, and inverted signals thereof A0* to A4*), which is obtained by combining the subordinate column address signal (ADCd) with the superordinate column address signal (ADCu). Therefore, all of the column address selection signals (CSi), from the start address to the stop address by the column address signal (ADC), can be rendered to be the selective level, and these column addresses are selected simultaneously so that the same data can be written simultaneously.

Specifically, regardless of the extent, the block write can be performed by the set of the start address, the set of the stop address, and the selection of all of the column addresses ranging from the start address to the stop address, whereby the operation time can be shortened compared to the conventional semiconductor memory device.

In the normal writing and reading operations, the column address is cut from other column addresses by rendering the block write signal (BW) to be the active level, and the outputs from the latch circuits LC11 and LC12 of the column address designated by the subordinate column address signal (ADCd) of each of the segments are rendered to be the active level by rendering the start address latch signal STL and the stop address latch signal (SPL) to be the active level simultaneously. Thus, the segment address selection signal (SASj) of one segment designated by the superordinate column address signal (ADCu) is rendered to be the selective level, so that the column address selection signal (LSi) of one column address of one segment, that is, one column address designated by the column address signal (ADC), is rendered to be the selective level.

The selection segment address set circuits (SSSj) shown in FIG. 7 have principally also the same circuit configuration as the selection column address set circuits SCSi. However, each of the selection segment address set circuits SSSj corresponds to the corresponding one of the superordinate addresses, so that the circuit configuration thereof is simplified. In addition, according to principally the same operation, the segment address selection signals (SASj) ranging from the start address to the stop address designated by the superordinate address signal ADCu are rendered to be the selective level.

Figure 8:
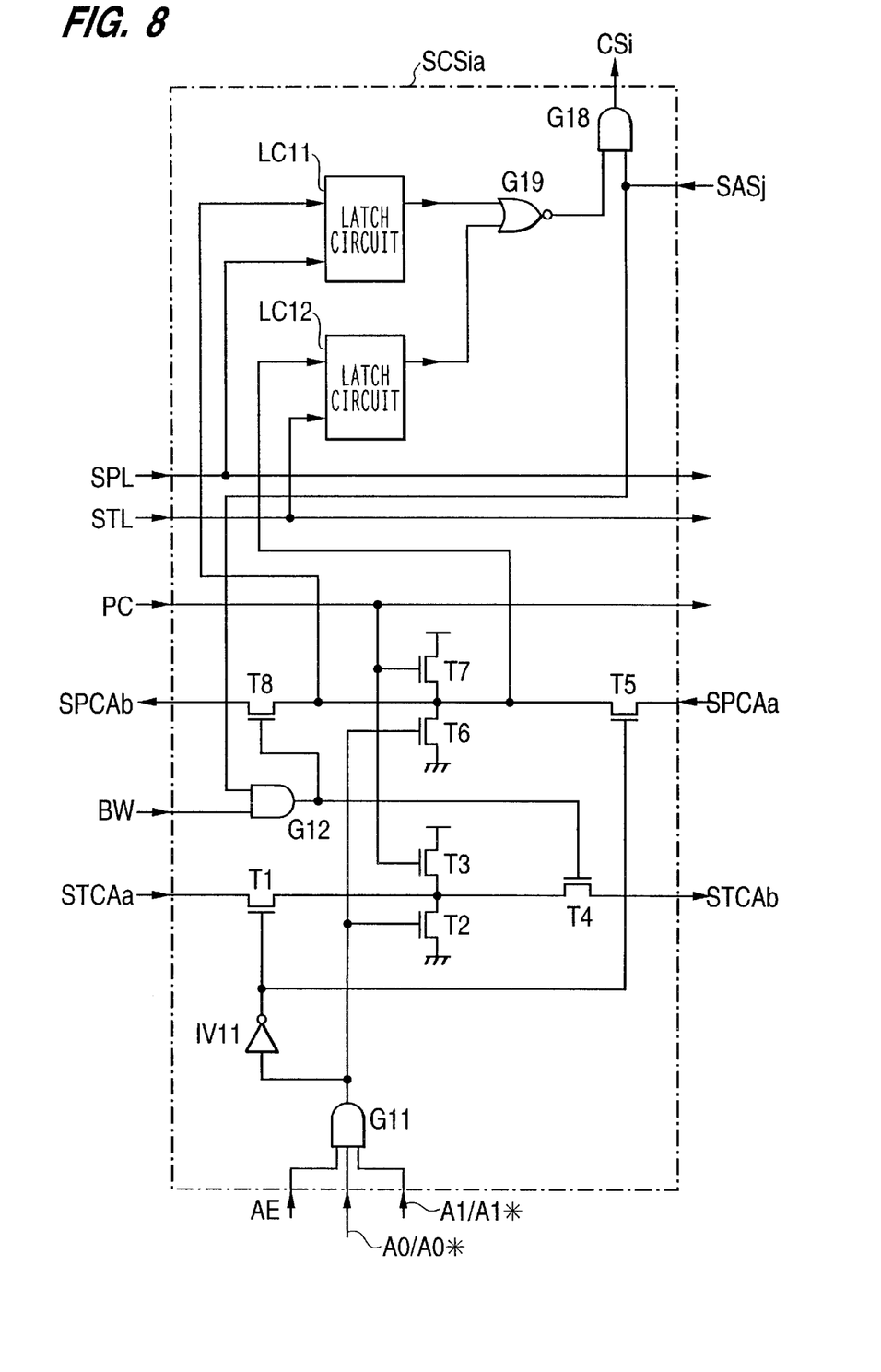
FIG. 8 is a circuit diagram showing a concrete example of a selection column address set circuit of a second embodiment of the present invention.

FIG. 8 is a circuit diagram showing a concrete example of the selection column address set circuit of a second embodiment of the present invention.

The selection column address set circuit SCSia of this embodiment is constituted such that the transmission and level set of the start address signal (STCA) and stop address signal (SPCA) are conducted using transistors. As a result, the number of circuit components can be reduced as compared to the example of FIG. 6.

The principal operation of this selection column address set circuit SCSia is the same as the example of FIG. 6. However, the active level of the start address signal (STCA) and stop address signal (SPCA) is low in level (in the example of FIG. 6, high in level), and after these signals are precharged once to a predetermined level by a precharge signal (PC), the level set is conducted.

It should be noted that the selection segment address set circuit can also be configured in the same configuration as FIG. 8.

Figure 9:
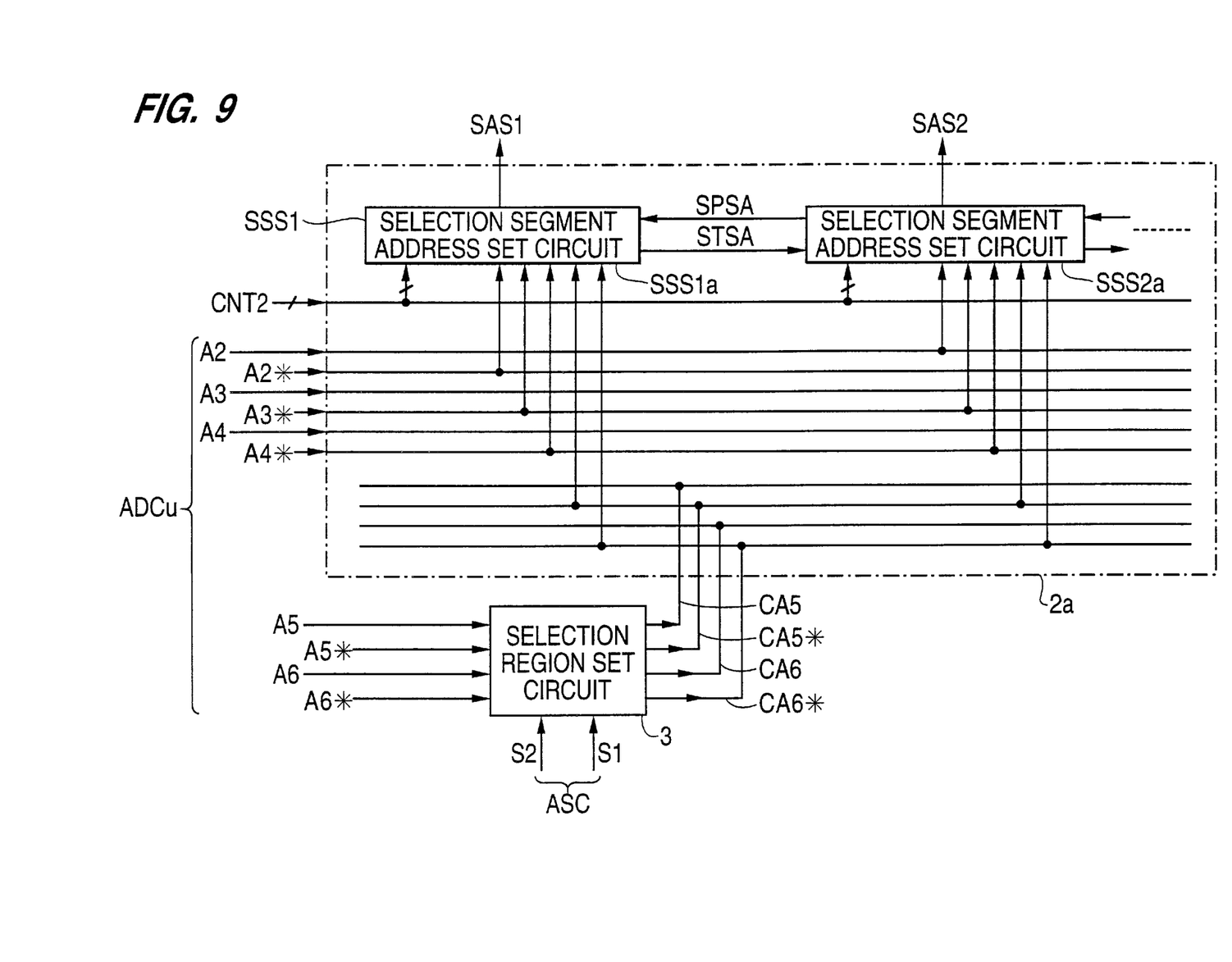
FIG. 9 is a block diagram showing a major portion of a third embodiment of the present invention.

FIG. 9 is a block diagram showing a major portion of a third embodiment of the present invention.

In the third embodiment, the segments, each of which is composed of four columns as one segment, are provided four times as many as in the first embodiment. Specifically, the superordinate column address signal (ADCu) is composed of 10 bits (including inverted signal thereof), and the selection control for the segment address similar to that of the first embodiment is conducted with 6 bits of the subordinate side (A2 to A4 and inverted signals thereof) of the superordinate column address (ADCu), and the circuits for the four blocks are provided. The selection control for the four blocks is conducted with 4 bits of the superordinate side (A5 and A6, and inverted signals thereof) of the superordinate column address (ADCu).

The selection control for the four blocks is conducted by a selection region set circuit 3 which supplies the superordinate bits (A5 and A6, and inverted signals thereof A5* and A6*) of the superordinate column addresses (ADCu) to the segment address selection circuit 2a by controlling the level of them. The segment address selection circuit 2a is constituted such that the signal obtained by combining the signal from this selection region set circuit 3 with the bits of the subordinate side (A2 to A4, and A2* to A4*) of the superordinate column address signal (ADCu) is decoded to determine the level of the segment address selection signal (SASj).

Figure 10A:
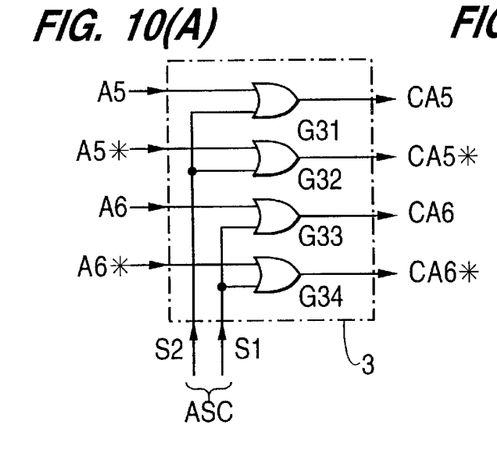
Figure 10B:
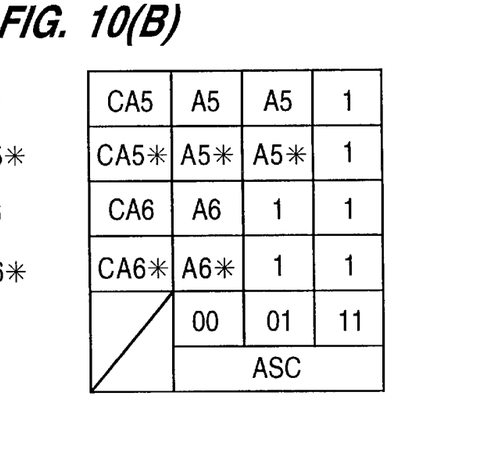
Figure 11A:
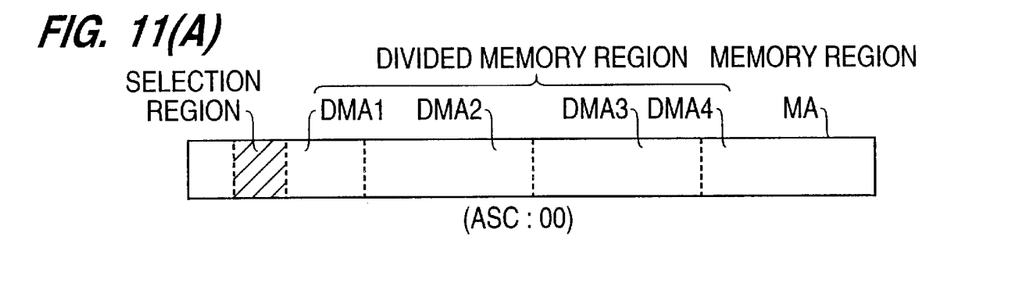

A concrete circuit example of the selection region set circuit 3 comprises OR type logic gates G31 to G34, as shown in FIGS. 10 (A) and 10 (B). The level of the bits of the superordinate side (A5 and A6, and A5* and A6*) is controlled with a selection region control signal {ASC (constituent bits S1 and S2)} to decide whether the number of the selected regions (blocks) is one or plural. For example, when the selection region control signal (ASC) is made "00", the bits of the superordinate (A5 and A6, and A5* and A6*) are transmitted to the segment address selection circuit 2a as they are, and the start address and stop address are decided by all bits of the superordinate address signal (ADCu). Therefore, as shown in FIG. 11(A), the memory region MA which comprises four blocks is treated as one region, and the segment address of the specified region is selected from the memory region.

Figure 11B:
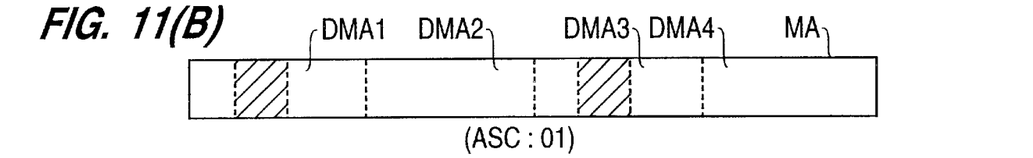

In addition, when the superordinate bits A6 and A6* of the bits of the superordinate side are fixed at the level "1" by rendering the selection region control signal (ASC) to be "01", the memory region MA is divided into two pieces as shown in FIG. 11 (B), the start address and stop address are set in each of the two regions, and the segment address is selected from each of the start address and stop address of each of the regions.

Figure 11C:
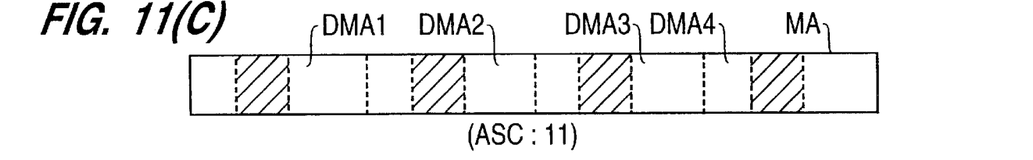

Furthermore, when all of the bits of the superordinate side are fixed to the level "1" while keeping the selection region control signal (ASC) at "11", as shown in FIG. 11 (C), it will be possible to divide the memory cell array region MA into four regions and the segment address of the predetermined region of each of the four regions is selected.

Therefore, as shown in FIG. 4, in the event that the same data is written to the column addresses "a" to "b" and "E/2+a" to "E/2+b", it was required to repeat the same operation twice in the conventional semiconductor memory device. However, in this embodiment, it suffices that such operation is performed once. In addition, such operation performed once is composed of only three steps, whereby operation time can be greatly reduced.

In the foregoing embodiment, the number of the columns in one segment is four as an example. However, any number of the columns in one segment will be sufficient depending on the use. In addition, the number of the segments may be decided according to capacity of the memory.

Furthermore, in the foregoing embodiments, the examples are adopted that the segment address and the column address are selected to be controlled. However, if the selection column address set circuit is constituted such that it decodes all bits of the column address signal to set the start address and stop address, it is not needed to provide the segment address selection circuit. In addition, in this case, the concept of the segment is vanished. Moreover, also in this case, by controlling the level of the bits of the superordinate side among the column address signals, the same data can be written to a plurality of regions simultaneously.

As described above, according to the present invention, on the block write mode, all of the column addresses from the start address to the stop address are selected simultaneously, and the same data is written to the region of this extent. Thus, the same data can be written to any region simultaneously for three steps of the start address set, stop address set, and selection of all column addresses from the start address to the stop address, so that the block write operation can be performed quickly. Even in the event that the same data is written to a plurality of regions, these regions can be selected, simultaneously, by the selection region set circuit. Therefore, the same data can be written to a plurality of regions by the three step operations like the above so that the block write operation can be performed quickly.

What is claimed is:

1. A semiconductor memory device, comprising:
 prescribed memory cells into which the same data are written in a block write mode, the prescribed memory cells belonging to a plurality of prescribed memory cell columns of a memory cell array having the memory cells arranged in row and column directions in a matrix,
 wherein said semiconductor memory device is configured such that, in said block write mode, all of the memory cell columns that correspond, from a start address to a stop address, are simultaneously selected to write the same data to each of the prescribed memory cells of the selected memory cell columns, and
 wherein said semiconductor memory device comprises:
  a memory cell array in which a plurality of memory cells are arranged in row and column directions in a matrix,
  a row selection circuit which simultaneously selects the memory cells of said memory cell array belonging to the same row,
  a column selection circuit which selects a prescribed memory cell column of said memory cell array according to a column address selection signal, and
  a column address selection circuit which comprises a plurality of start address latch circuits and a plurality of stop address latch circuits, each of the start address latch circuits and the stop address latch circuits being arranged to correspond to one of the memory cell columns of said memory cell array,
  wherein in the block write mode, a start address signal of an active level is set to the start address latch circuit of the memory cell column corresponding to a start address in a first timing, a stop address latch circuit of an active level is set to the stop address latch circuit of the memory cell column corresponding to a stop address in a second timing, and said column address signal, from the memory cell column corresponding to said start address signal of the active level to the memory cell column corresponding to said stop address signal of the active level, is set to a selection level.

2. The semiconductor memory device according to claim 1, further comprising:
 a plurality of segment start address latch circuits and a plurality of segment stop address latch circuits, each of which is arranged to correspond to one of a plurality of segments, wherein all of the memory cells columns of the memory cell array are grouped into the plurality of segments, each of the segments corresponding to the memory cell columns of a predetermined number adjacent to each other, and wherein the start address latch circuits and the stop address latch circuits of the column address selection circuit are groused into the plurality of segments; and
 a segment address selection circuit, in which in the block write mode, a segment start address signal of an active level is set, at the first timing, to a segment address latch circuit of said segments corresponding to a segment start address by a prescribed subordinate side bit of a column address signal, and a segment stop address signal of an active level is set, at the second timing, to a segment stop address latch circuit of said segment corresponding to a segment stop address by a prescribed superordinate side bit of said column address signal, wherein a segment address selection signal, from a segment corresponding to said segment start address signal of an active level to a segment corresponding to said segment stop address signal of an active level, is set to a selection level; and
 wherein said column address selection circuit is configured such that setting of a start address signal of an active level to one of said start address latch circuits and setting of a stop address signal of an active level to one of said stop address latch circuits are performed by a prescribed subordinate side bit of said column address signal; and a column address selection signal, from a memory cell column corresponding to a start address to a memory cell column corresponding to a stop address due to said column address signal, is set to a selection level, said column address signal being obtained by combining a subordinate bit with a superordinate bit by said segment address selection signal, said start address signal and said stop address signal.

3. The semiconductor memory device according to claim 1, further comprising a selection region set circuit wherein an address region of a memory cell column of a memory cell array is divided into a plurality of areas which are capable of being selected by a predetermined bit of column address signals, and a level of the prescribed bit of said column address signal is controlled to determine either individual selection of said areas or simultaneous selection of prescribed areas of the areas by the prescribed bit of said column address signals, and wherein said column address selection circuit is configured such that the start address signal of an active level and the stop address signal of an active level are set corresponding to each of the selected areas by said selection region set circuit.

4. The semiconductor memory device according to claim 1, wherein said column address selection circuit comprises a plurality of AND gates and OR gates.

5. The semiconductor memory device according to claim 2, wherein said segment address selection circuit comprises a plurality of AND gates and OR gates.

6. The semiconductor memory device according to claim 2, wherein, after the segment start address signal of the active level is set, the segment start address signal is sequentially transmitted to the prescribed superordinate side bit.

* * * * *